United States Patent [19]

Boyer et al.

[11] 4,421,265
[45] Dec. 20, 1983

[54] WAVE-SOLDERING A MEMBER TO AN ARTICLE

[75] Inventors: Albert E. Boyer, Peabody; John T. Callahan, Nahant; Peter P. Filocamo, Methuen, all of Mass.

[73] Assignee: Western Electric Company, Inc., New York, N.Y.

[21] Appl. No.: 252,766

[22] Filed: Apr. 10, 1981

[51] Int. Cl.³ .............................................. B23K 1/08
[52] U.S. Cl. .................................. 228/180 R; 228/39; 228/260; 228/57
[58] Field of Search ............... 228/37, 39, 180 R, 184, 228/215, 259, 260; 118/213, 301, 406, 504; 29/25.35; 198/690; 220/5, 66, 67

[56] References Cited

U.S. PATENT DOCUMENTS

| | | | |
|---|---|---|---|
| 659,381 | 10/1900 | Smyth | 228/37 |
| 3,871,510 | 3/1975 | Homeier | 198/690 |

OTHER PUBLICATIONS

Mass Soldering Loading Fixture Having Masking Pins, by A. E. Boyer, J. M. Habib, Western Electric, Jan. 1971.

Primary Examiner—Kenneth J. Ramsey
Assistant Examiner—M. Jordan
Attorney, Agent, or Firm—D. D. Bosben

[57] ABSTRACT

A solder mask (62) of special construction is mounted on each of a plurality of crystal filters (10) having continuous seams (16) defined by peripheral edges (20) of filter metal covers (14) and peripheral portions (18) of filter metal headers (12). The crystal filter-solder mask assemblies (10,62) then are passed over a solder wave (24) to solder the continuous seams (16) of the crystal filters (10) simultaneously. The crystal filters (10) are suspended on magnetic carriers (104) of an endless conveyor (106) as the filters pass over the solder wave. During the wave-soldering operation the solder masks (62) preclude solder from access to various critical areas of the crystal filters (10).

19 Claims, 10 Drawing Figures

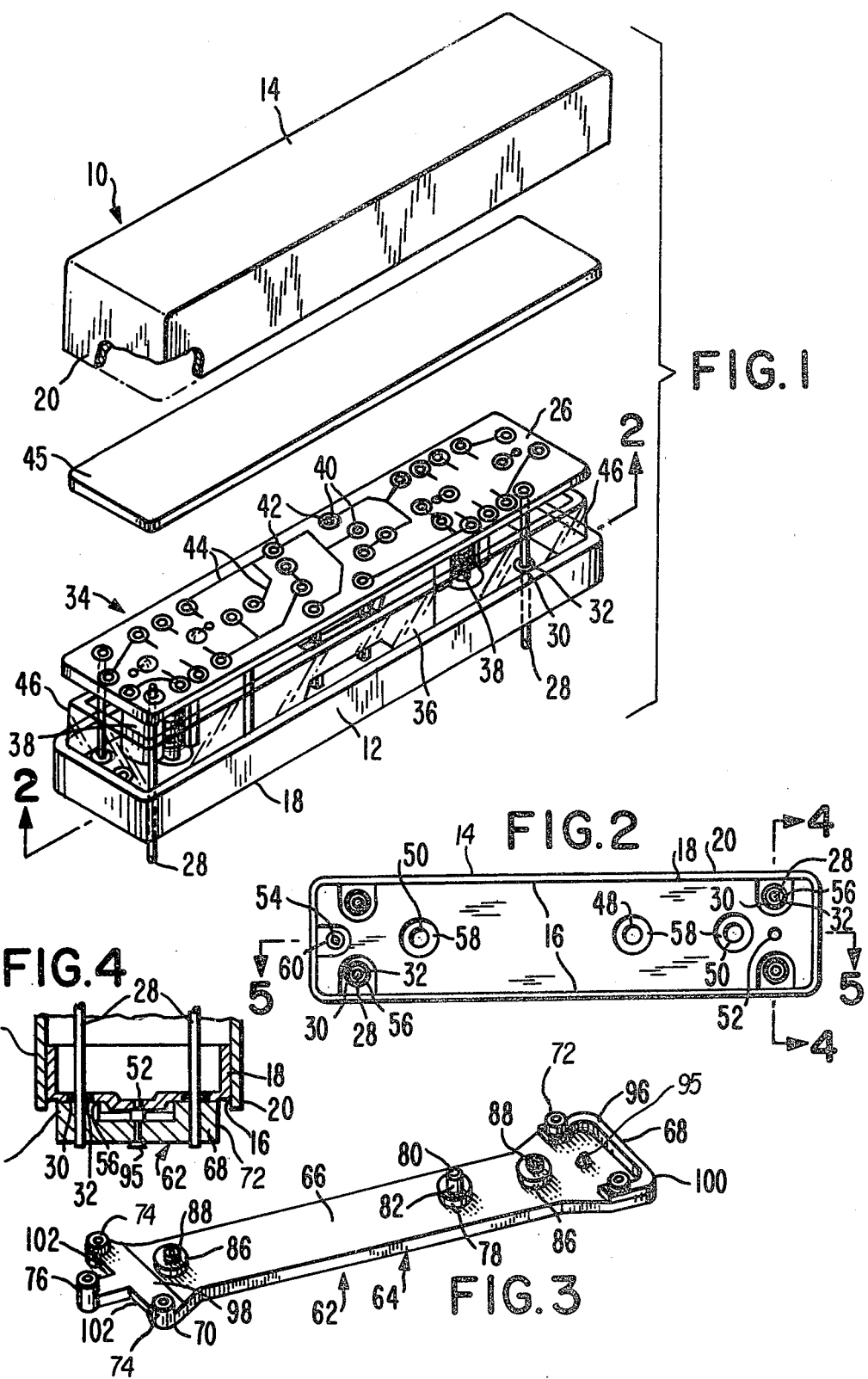

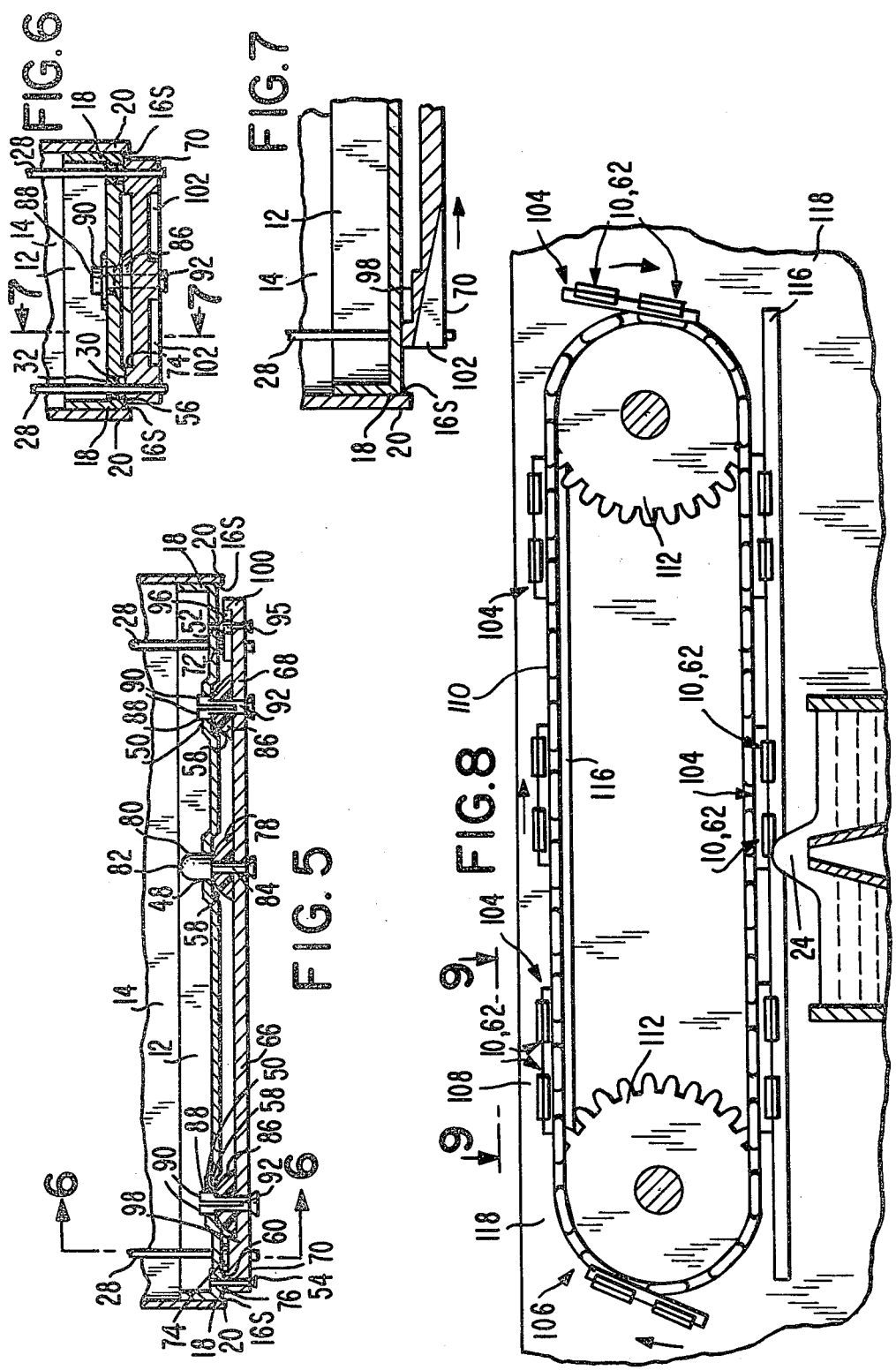

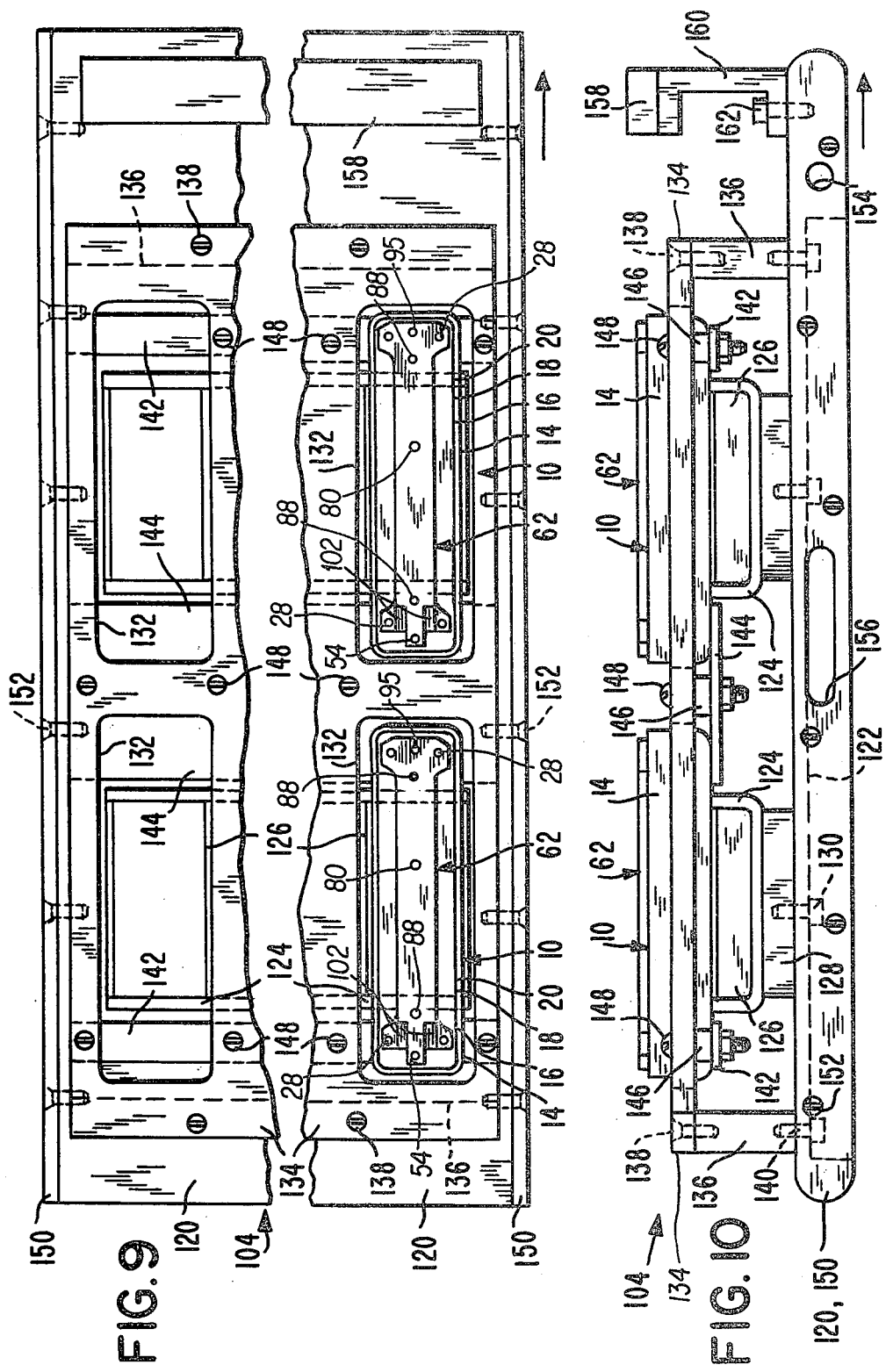

WAVE-SOLDERING A MEMBER TO AN ARTICLE

TECHNICAL FIELD

This invention relates to the wave-soldering of a member to an article, and more particularly to the soldering of a continuous peripheral edge of a protective cover to an article by passing the article and the continuous peripheral edge of the cover over a solder wave.

BACKGROUND OF THE INVENTION

In the manufacture of certain electronic devices, such as a crystal filter of a type used in signal transmission equipment, components of the device are mounted on a printed circuit board having leads mounted on a pretinned metal header. More specifically, the leads of the printed circuit board extend through apertures in the metal header for mounting the filter on another printed circuit board, and are secured in the header apertures by an electrical insulating material, such as glass, extending about the leads so as to electrically isolate the leads from the header. The metal header also has openings formed therethrough, as for example to permit subsequent access to adjustable parts of the filter after the filter has been enclosed in a pretinned metal cover by soldering a peripheral edge of the cover to a peripheral portion of the metal header. Subsequently, the access openings in the metal header also are sealed in a known manner, to form a hermetically sealed unit.

In soldering the peripheral edge of the filter cover to the metal header, it is essential that none of the printed circuit board leads projecting from the metal header become shorted to the header. Further, it is essential that no solder be permitted to flow through the openings of the metal header into the cover, since this could damage the components of the filter. Accordingly, in the past the soldering of the peripheral edge of the cover to the header has been accomplished by hand, using a soldering iron. This procedure is undesirable because it is inefficient and time-consuming, and usually results in a soldered seam which is of non-uniform construction.

Accordingly, a primary purpose of this invention is to provide a method and apparatus in which a plurality of cover-header assemblies are uniformly soldered simultaneously by passing the assemblies over a solder wave.

SUMMARY OF THE INVENTION

In general, a portion of a member, such as a peripheral edge of a protective cover, is soldered to an article by assembling the member to the article and then passing the assembled member and article over a solder wave such that the portion of the member and an adjacent portion of the article are engaged by the solder wave.

More specifically, selected portions of each of a plurality of the articles initially are masked by a rigid snap-on solder mask comprising a member of a solder-non-wettable metal, to preclude access of solder to the selected portions of the articles. The articles and associated cover members then are magnetically supported on a support means and passed over a solder wave to solder continuous peripheral edges of the cover members to their respective articles simultaneously. The metal mask member is of special construction to insure contact of the solder wave with the entire continuous peripheral edge of the cover member during the soldering operation, and to preclude the formation of solder ridges on the article as the result of edge portions of the mask member being in direct contact with the article.

BRIEF DESCRIPTION OF THE DRAWINGS

FIG. 1 is an exploded isometric view of an article having a cover member which can be soldered to a metal header of the article using the invention;

FIG. 2 is a view of the assembled article as seen along the line 2—2 in FIG. 1;

FIG. 3 is an isometric view of a metal solder mask for masking the metal header of the article in a wave-soldering operation;

FIG. 4 is an enlarged partial cross-sectional view of the assembled article as viewed along a line 4—4 in FIG. 2;

FIG. 5 is a partial cross-sectional view of the article, with the solder mask shown in FIG. 3 mounted thereon, as seen along a line 5—5 in FIG. 2;

FIG. 6 is a partial cross-sectional view of the article and solder mask taken along the line 6—6 in FIG. 5;

FIG. 7 is a partial cross-sectional view of the article and solder mask taken along the line 7—7 in FIG. 6;

FIG. 8 is a schematic view of apparatus in accordance with the invention;

FIG. 9 is a partial plan view of an article carrier of the apparatus as viewed along the line 9—9 in FIG. 8; and FIG. 10 is an elevational view of the article carrier shown in FIG. 9.

DETAILED DESCRIPTION

Referring to FIGS. 1 and 2, a crystal filter 10 which may be soldered utilizing the subject invention, is disclosed. In general, the crystal filter 10 includes a metal header 12 and a protective metal cover 14 having a continuous seam 16 (FIG. 2) defined by a peripheral portion 18 of the header and an adjacent continuous peripheral edge 20 of the cover. The header 12 and the cover 14 are formed of a solder-wettable metal, such as steel, with the header having a tinned outer surface to facilitate the adherence of solder thereto. In accordance with this invention, the peripheral edge 20 of the cover 14 is soldered to the peripheral portion 18 of the header 12 to close the seam 16 by passing the assembled header-and-cover over a suitable solder wave 24 (FIG. 8) having one or more solder crests, to form a soldered seam 16S therebetween, as illustrated in FIGS. 5-7.

More specifically, in addition to the metal header 12 and the metal cover 14, the crystal filter 10 includes a printed circuit board 26 (FIG. 1) having four depending leads 28 soldered at their upper ends to respective corner portions of the board. The leads 28 extend through apertures 30 in the metal header 12 so as to project from the header as shown in FIGS. 1 and 4, for mounting the crystal filter 10 on another printed circuit board, not shown. As is shown in FIG. 4, the leads 28 are electrically isolated from the metal header 12 by an electrical insulating material 32, such as glass, in the apertures 30.

The crystal filter 10 further includes a plurality of electrical components 34, namely, a crystal plate network 36, a pair of inductors 38 and a pair of capacitors (not shown), mounted on an inner side of the printed circuit board 26 by respective leads 40 which extend through the board and which are soldered to contact pads 42 on an outer side of the board. The electrical components 34 are electrically connected to one another and to the filter mounting leads 28 by suitable circuit paths 44 on opposite sides of the printed circuit board 26, with only the circuit paths on the outer side of the board being shown. The printed circuit board 26 is insulated from the metal cover by a rectangular strip 45 of plastic insulating material. In accordance with this invention, an elongated protective plastic strip 46 (FIG. 1) is disposed inside the metal header 12 and wrapped about the components 34 to preclude any contamination from depositing on crystal plates of the filter through the seam 16 during a wave soldering operation.

As is best shown in FIG. 2, the metal header 12 includes an aperture 48 for inserting an adjusting tool (not shown) into the crystal filter 10 to adjust the crystal plate network 36 after the metal cover 14 has been soldered to the header, a pair of similar apertures 50 for adjusting the inductors 38, a small venting aperture 52 at the right-hand end of the header, as viewed in FIG. 2, and a ground lead 54 secured to and projecting from the header at the left-hand end thereof, as viewed in FIG. 2. The venting aperture 52 precludes the detrimental buildup of pressure within the soldered crystal filter 10 when the adjustment apertures 48 and 50 are subsequently closed by soldering sealing discs (not shown) therein, after which the venting aperture also is suitably closed to produce a hermetically sealed device. To facilitate processing of the crystal filter 10 utilizing this invention, the filter as above described is modified by forming embossed cylindrical seats 56 and 58 about the mounting leads 28 and the adjustment apertures 48 and 50, respectively, and an embossed cylindrical seat 60 about the ground lead 54.

Referring to FIG. 3, in accordance with this invention a solder mask 62 of special construction is utilized to preclude access of solder to the insulating material 32 which electrically isolates the filter support leads 28 from the metal header 12, and to the interior of the filter through the component adjustment apertures 48 and 50, and the venting aperture 52 in the header. At the same time, the configuration of the solder mask 62 is such as to permit ready access of the solder to the crystal filter seam 16.

More specifically, the solder mask 62 includes an elongated member 64 formed of a solder—nonwettable metal, such as #304 stainless steel, which also readily absorbs heat to preclude an excessive build-up of heat in the crystal filter 10 during a wave-soldering operation. The metal mask member 64 includes an elongated narrow central body portion 66, an enlarged leading end portion 68 and an enlarged trailing end portion 70.

The enlarged end portions 68 and 70 of the metal mask member 64 each are formed with two raised cylindrical pedestals 72 and 74, respectively, having central apertures extending therethrough for receiving the filter support leads 28 as illustrated in FIG. 4 by the enlarged leading end portion 68. The enlarged trailing end portion 70 further includes another raised cylindrical pedestal 76 having an aperture therethrough for receiving the ground lead 54 on the metal header 12. When the solder mask 62 is mounted on the metal header 12, the raised pedestals 72 and 74 seat against their respective embossed seats 56 surrounding the filter support leads 28, as shown in FIG. 4, to preclude access of solder in the solder wave 24 (FIG. 8) to the insulating material 32 surrounding the leads during a wave-soldering operation. Similarly, the pedestal 76 seats on the embossed seat 60 surrounding the ground lead 54 to preclude the solder wave 24 from adversely disturbing the soldered connection between the ground lead and the metal header 12 during the wave-soldering operation.

Referring to FIGS. 3 and 5, to preclude flow of solder into the interior of the crystal filter 10 through the crystal plate network adjustment aperture 48 in the metal header 12 during a wave-soldering operation, an annular essentially dome-shaped plastic seal 78, with a flat top, is secured to the central body portion 66 of the metal mask member 64 by a cylindrical metal pin 80. The metal pin 80 includes an enlarged cylindrical aligning portion 82 of essentially the same diameter as the adjustment aperture 48 for precisely locating the solder mask 62 on the metal header 12. The metal pin 80 also includes a stem portion 84 (FIG. 5) of reduced diameter which extends through the seal 78 and which is fixedly secured in the central body portion 66.

A pair of annular essentially dome-shaped plastic seals 86, with flat tops, also is secured to the central body portion 66 of the metal mask member 64 by respective bifurated snap-in metal pins 88, for sealing the inductor adjustment apertures 50 in the metal header 12 during a wave-soldering operation. Each of the pins 88 includes an enlarged split head 90 (FIG. 5), and a reduced shank 92 which extends through the adjacent seal 86 and which is fixedly secured in the metal mask member central body portion 66. The split head 90 and a portion of the shank 92 are formed with a longitudinal slot to define a pair of spaced resilient legs, whereby the split head can be snapped into the respective aperture 50 with a snug fit to releasably secure the solder mask 62 to the metal header 12.

Similarly, a small plastic seal 95 having a conical tip portion is secured to the central body portion 66 of the metal mask member 64 for sealing the small venting aperture 52 in the metal header 12 during a wave soldering operation. The seals 78, 86 and 95 are formed of a heat-resistive plastic such as that sold by E. I. du Pont de Nemours and Company under the trademark "Teflon."

The raised cylindrical pedestals 74 are formed on legs of a continuous essentially U-shaped raised flange 96 of the enlarged end portion 68 of the metal mask member 64, and the raised cylindrical pedestals 72 are formed on a T-shaped raised reinforcing rib 98 of the enlarged trailing end portion 70 of the metal mask member. Thus, as is apparent from FIGS. 4–7, the pedestals 72 and 74 are the only portions of the metal mask member 64 in direct contact with the metal header 12 in a wave-soldering operation. Accordingly, any tendency for solder ridges to form on the surface of the metal header 12 in the wave soldering operation as a result of edge portions of the metal mask member 62 being in direct contact with the header, is essentially eliminated.

The construction of the metal mask member 64 is such as to facilitate access of the solder wave 24 (FIG. 8) to the entire seam 16 of the crystal filter 10 in a wave-soldering operation. For example, referring to FIGS. 3 and 5, the enlarged leading end portion 68 and the U-shaped flange 96 thereon define a leading end surface 100 of the metal mask member 64 which extends into closely spaced relationship to the metal header 12, when the mask member is mounted on the header, as above described, so as to essentially preclude the flow of solder between the flange and the header. Thus, in the wave-soldering operation the leading end surface 100 initially breaks up the surface of the solder wave 24 (FIG. 8) and forces solder upward toward the adjacent leading end of the crystal filter seam 16 to form the soldered seam 16S (FIG. 5). Then, as a result of the leading end surface 100 extending into closely spaced relationship with the metal header 12, the leading end surface functions as a dam to cause the solder to flow around the leading end of the metal mask member 64 to opposite sides of the metal header 12, where access of the solder to the opposite sides of the filter seam 16 simultaneously is facilitated as a result of the narrow central body portion 66 of the metal mask member being of reduced width so that opposite sides thereof are spaced from the sides of the seam. Access of solder to the sides of the seam 16 further is facilitated by the central body portion 66 of the metal mask member 64 being spaced from the metal header 12 so as to permit the free flow of solder therebetween. Finally, referring to FIGS. 3, 6 and 7, access of the solder wave 24 to the trailing end of the filter seam 16 is facilitated by a pair of solder flow-directing inclined grooves or slots 102 formed in the trailing end portion 70 of the metal mask member 64.

Referring to FIGS. 8, 9 and 10, a group of the crystal filters 10 may be soldered simultaneously by manually loading a plurality of the crystal filter-solder mask assemblies 10, 62 into one of a plurality of article carriers 104 on an endless conveyor 106 in a loading-unloading position 108 (FIG. 8). The conveyor 106 may be of a known type which includes a pair of spaced flexible link chains 110 (only one shown) which travel about sets of spaced sprockets 112 (only one set shown) to carry the article carriers 104 past the solder wave 24.

After the crystal filter-solder mask assemblies 10, 62 have been loaded on one of the article carriers 104, the conveyor 106 transports the assemblies 10, 62 in an inverted position through the solder wave 24 to a preselected depth, such as 1/16", to solder the seams 16 (FIGS. 2 and 9) of the crystal filters 10 as above described. Subsequently, the crystal filter-solder mask assemblies 10, 62 are manually removed from the article carrier 104 in the loading-unloading position 108 (FIG. 8), and the solder mask assemblies are removed from the filters 10. During the soldering operation, the article carriers 104 are slidably supported on upper and lower guide rails 116 mounted on opposed side walls 118 (only one shown) of the apparatus in a known manner.

Referring to FIGS. 9 and 10, each of the article carriers 104 may include a nonmagnetic metal (e.g., aluminum) base plate 120 having interior portions of the underside thereof milled out to form a recess 122 (FIG. 10) therein, so as to reduce the weight of the base plate. The base plate 120 has two transversely extending U-shaped magnetic holders 124 and a plurality of supplemental permanent bar magnets 126 mounted thereon. More specifically, each U-shaped magnetic holder 124 is suitably bonded or otherwise secured to a transversely extending nonmagnetic metal support block 128 (FIG. 10) secured to the base plate 120 by screws 130, and associated ones of the permanent bar magnets 126 are held in the U-shaped magnetic holder between opposite legs thereof by magnetic attraction.

The crystal filter-solder mask assemblies 10, 62 are supported on the U-shaped magnetic holders 124 over the bar magnets 126 as shown in FIGS. 9 and 10, with the covers 14 of the assemblies seated on upper ends of the legs of the holders. To preclude any significant shifting of the crystal filter-solder mask assemblies 10, 62 during the wave-soldering operation, the assemblies are disposed in respective elongated apertures 132 in a horizontally disposed rectangular nonmagnetic metal retaining plate 134 having opposite ends supported on the upper ends of vertical nonmagnetic metal plates 136 by screws 138, with the vertical plates being secured at their lower ends to the base plate 120 by screws 140. Further, opposite end portions of the crystal filter-solder mask assemblies 10, 62 rest upon a pair of transversely extending nonmagnetic metal support bars 142 and a transversely extending central nonmagnetic metal support bar 144, to preclude tipping of the assemblies on the U-shaped magnetic holders 124. The support bars 142 and 144 are mounted on the horizontal retaining plate 134 beneath the plate by cylindrical spacers 146 (FIG. 10) and nut-and-bolt assemblies 148.

The base plate 120 of each article carrier 104 also has a pair of steel wear plates 150 (FIGS. 9 and 10) secured to opposite sides thereof by screws 152. Each wear plate 150 includes a cylindrical aperture 154 (one shown in FIG. 10) adjacent the leading end (right-hand in FIGS. 9 and 10) of the article carrier 104 for receiving a mounting lug (not shown) suitably supported on a respective one of the conveyor chains 110 (FIG. 8), and further includes an elongated centrally located slot 156 (one shown in FIG. 10) for receiving a second one of the mounting lugs, whereby the article carrier can readily be mounted upon and removed from the conveyor 106. The elongated slot 156 provides a lost motion connection between the mounting lug received therein and the article carrier 104 to permit the article carrier to travel around the conveyor sprockets 112 (FIG. 8) in a well-known manner.

Adjacent the leading end (right-hand in FIGS. 9 and 10) of the article carrier 104, an elongated transversely extending bar 158 of a heat-resistive plastic is mounted on the base plate 120 for breaking up the solder wave 24 (FIG. 8) in a wave-soldering operation. The plastic bar 158 is bonded to an upper end of a channel-shaped metal member 160 secured at its lower end to the base plate 120 by screws 162.

In summary, a new and improved method of soldering a peripheral edge of an article, such as the peripheral edge 20 (FIGS. 1 and 2) of the protective metal cover 14 of the crystal filter 10, to another article, such as the crystal filter metal header 12, to form a continuous soldered seam 16S (FIGS. 5 and 7) between the cover and the header, is disclosed. More specifically, the soldering is accomplished by attaching the solder masks 62 (FIG. 3) to respective ones of the metal headers 12 of a plurality of the crystal filters 10, and loading the crystal filter-solder mask assemblies 10, 62 into one of the magnetic article carriers 104 (FIGS. 8, 9 and 10) on the conveyor 106 (FIG. 8). The crystal filter-solder mask assemblies 10, 62 then are transported by the conveyor 106 through the solder wave 24 (FIG. 8) to solder the peripheral edges 20 of the crystal filter metal covers 14 to the metal headers 12 simultaneously. During the wave-soldering operation the solder masks 62 preclude access of the solder to critical areas of the crystal filters 10, such as the insulating material 32 surrounding the filter support leads 28, the adjustment openings 48 and 50 in the metal headers 12, and the venting openings 52 in the metal headers. At the same time, as a result of the unique construction of the solder mask 62, and particularly the metal mask member 64, flow of solder to all portions of the crystal filter seams 16 is facilitated to form soldered seams 16S of uniform construction.

What is claimed is:

1. A method of soldering a peripheral edge of a cover member to an article, which comprises:

assembling the cover member to the article with opposite side peripheral edge portions of the cover member adjacent respective opposite side portions of the article; and passing the assembled cover member and article over a solder wave such that the opposite side peripheral edge portions of the cover member engage the solder wave simultaneously to solder the opposite peripheral edge portions of the cover member to the article.

2. A method of soldering a peripheral edge of a cover member to an article, which comprises:

assembling the cover member to the article;

magnetically suspending the assembled cover member and article adjacent a solder wave; and passing the magnetically suspended cover member and article over the solder wave such that the peripheral edge of the cover member and the article are engaged by the solder wave to solder the peripheral edge of the cover member to the article.

3. The method as recited in claim 2, in which:

a plurality of the assembled cover members and articles are magnetically suspended and passed over the solder wave simultaneously.

4. The method as recited in claim 1, in which the peripheral edge of the cover member is continuous and surrounds a portion of the article when the cover member is assembled to the article, and in which:

the assembled cover member and article are passed over the solder wave such that a leading peripheral edge portion of the cover member and an adjacent portion of the article engage the solder wave prior to the simultaneous engagement of the opposite side portions of the cover member and the article with the solder wave, and such that a trailing peripheral edge portion of the cover member and an adjacent portion of the article engage the solder wave subsequent to the simultaneous engagement of the opposite side portions of the cover member and the article with the solder wave; and a masking means of solder-nonwettable material is mounted on the portion of the article surrounded by the continuous peripheral edge of the cover member to preclude access of solder to preselected portions of the article as the assembled cover member and article are passed over the solder wave.

5. The method as recited in claim 1, in which the article has a plurality of projecting portions, and in which:

a masking member of solder-nonwettable material is mounted on the article by extending the projecting portions of the article through apertures in the masking member.

6. The method as recited in claim 5, in which the article has at least one opening therein, and in which:

the opening in the article is sealed by a masking means of solder-nonwettable material on the masking member to preclude flow of solder through the opening during the wave-soldering operation.

7. A method of soldering a peripheral edge of a cover member to an article, in which the article has at least one opening therein and at least one insulated lead projecting therefrom, which comprises:

assembling the cover member to the article;

sealing the opening in the article and masking a portion of the article surrounding the lead simultaneously by mounting a masking means of solder-nonwettable material on the article; and passing the assembled cover member and masked article over a solder wave such that the peripheral edge of the cover member and the article are engaged by the solder wave to solder the peripheral edge of the cover member to the article.

8. Apparatus for soldering a peripheral edge of a cover member to an article, which comprises:

a means for generating solder wave;

conveyor means movable adjacent the solder wave for moving the cover member and the article over the solder wave such that the peripheral edge of the cover member and the article engage the solder wave; and magnetic means mounted on the conveyor for magnetically suspending the cover member and the article therebeneath as the cover member and the article pass over the solder wave.

9. Apparatus as recited in claim 8, which further comprises:

retaining means for precluding substantial shifting of the cover member and the article on the magnetic support means as the cover member and the article pass over the solder wave.

10. Apparatus as recited in claim 9, in which:

the retaining means includes a plate member having a plurality of spaced slots for receiving respective ones of a plurality of the cover members and articles supported on the magnetic means.

11. Apparatus as recited in claim 8, in which the peripheral edge of the cover member is continuous and surrounds a portion of the article, and which further comprises:

masking means of solder-nonwettable material for precluding access of solder to preselected portions of the article surrounded by the continuous peripheral edge of the cover member during a wave-soldering operation.

12. Apparatus as recited in claim 8, in which the article has at least one opening therein and at least one insulated lead projecting therefrom, and which further comprises:

masking means of solder-nonwettable material and of essentially unitary construction for sealing the opening and masking a portion of the article surrounding the lead simultaneously.

13. A solder mask, which comprises:

an essentially planar member formed of a solder-nonwettable material, the essentially planar member including enlarged opposite end portions and a central portion, the enlarged opposite end portions including respective portions which are raised relative to the central portion to permit flow of solder between the central portion and the article in a soldering operation; and pedestal means on the raised portions of the enlarged end portions of the essentially planar member for engaging and masking selected areas of the article to preclude access of solder thereto in the soldering operation, the pedestal means being further raised relative to the raised portions of the enlarged end portions to permit flow of solder between the raised portions and the article in the soldering operation.

14. A solder mask as recited in claim 13, in which:

the essentially planar member is of rigid metal construction.

15. A solder mask, which comprises:

a rigid essentially planar member formed of a solder-nonwettable metal;

pedestal means on the essentially planar member for engaging selected areas of an article to preclude access of solder thereto, the pedestal means being raised relative to the remainder of the essentially planar member to permit flow of solder between the member and the article in a soldering operation; and plastic seal means on the essentially planar member for sealing an opening in the article.

16. A solder mask as recited in claim 15, which further comprises:

a resilient snap-in type fastener pin having a head portion receivable in an opening in the article, the plastic seal means being supported on the snap-in type fastener pin.

17. A solder mask as recited in claim 13, in which:

the enlarged end portions and the raised pedestal means have apertures formed therethrough for receiving projecting portions of the article to mount the essentially planar member on the article.

18. A solder mask as recited in claim 13, in which:

the central portion of the essentially planar member is of reduced width with respect to the enlarged end portions of the planar member to facilitate flow of solder to opposite sides of the article in the soldering operation.

19. A solder mask as recited in claim 13 in which:

the raised pedestal means are formed on the raised portions of the enlarged opposite end portions of the essentially planar member on one side of the member; and an opposite side of the essentially planar member includes an inclined slot extending from an interior portion of the member and opening through a peripheral edge of one of the enlarged end portions.

* * * * *